（12）United States Patent
Anzicek (10) Patent No.: US 9,720,049 B2
(45) Date of Patent: Aug. 1, 2017

(54) SYSTEM AND METHOD FOR HIGH VOLTAGE SYSTEM ISOLATION RESISTANCE MEASUREMENT (71) Applicants: Robert Bosch Battery Systems LLC, Orion, MI (US); Robert Bosch GmbH, Stuttgart (DE)

(72) Inventor: Joshua Anzicek, Clarkston, MI (US)

(73) Assignees: Robert Bosch Battery Systems LLC, Orion, MI (US); Robert Bosch GmbH, Stuttgart (DE)

( * ) Notice: Subject to any disclaimer, the term of this patent is extended or adjusted under 35 U.S.C. 154(b) by 180 days.

(21) Appl. No.: 14/793,804

(22) Filed: Jul. 8, 2015

(65) Prior Publication Data
US 2016/0025816 A1 Jan. 28, 2016

Related U.S. Application Data (60) Provisional application No. 62/027,515, filed on Jul. 22, 2014.

(51) Int. Cl.
*G01N 27/416* (2006.01)
*G01R 31/36* (2006.01)
*G01R 27/02* (2006.01)
*H02J 7/00* (2006.01)

(52) U.S. Cl.
CPC ....... *G01R 31/3658* (2013.01); *G01R 27/025* (2013.01); *H02J 7/0047* (2013.01); *G01R 31/362* (2013.01); *G01R 31/3606* (2013.01)

(58) Field of Classification Search
CPC ...... H02J 7/0013; H02J 7/0019; H02J 7/0024; G01R 31/3658

USPC ......... 320/116, 117, 119, 121; 324/430, 433, 324/434
See application file for complete search history.

(56) References Cited

U.S. PATENT DOCUMENTS

| | | | |
|---|---|---|---|
| 5,656,915 A * | 8/1997 | Eaves | H01M 10/482 320/118 |
| 2010/0134069 A1 | 6/2010 | Oosawa et al. | |
| 2012/0280697 A1 | 11/2012 | Morimoto | |
| 2013/0049971 A1 | 2/2013 | Hermann | |
| 2014/0058687 A1 | 2/2014 | Wang et al. | |
| 2014/0084933 A1 | 3/2014 | Jang et al. | |
| 2014/0152318 A1 | 6/2014 | Bertrand et al. | |
| 2014/0159496 A1* | 6/2014 | Lee | H02J 1/10 307/80 |
| 2014/0239637 A1* | 8/2014 | Sink | F02N 11/0866 290/31 |

(Continued)

*Primary Examiner* — Edward Tso
(74) *Attorney, Agent, or Firm* — Maginot Moore & Beck LLP (57) ABSTRACT

A circuit that measures isolation resistance in a battery pack that is associated with a load includes four resistors. Two resistors are connected between terminals of the battery pack and another two resistors are connected in the load in parallel to the resistors in the battery pack. A controller operates two contactors to disconnect the battery from the load and measure first and second voltages in the battery pack and one of the two resistors. The controller operates the two contactors to connect the battery to the load and measures third and fourth voltages in the battery pack and one of the two resistors. The controller identifies the isolation resistance with reference to resistance values of the four resistors and the first, second, third, and fourth measured voltages.

9 Claims, 6 Drawing Sheets (56) References Cited

U.S. PATENT DOCUMENTS

2015/0028672 A1\* 1/2015 Zhu .......................... H02J 1/00
307/31

\* cited by examiner

SYSTEM AND METHOD FOR HIGH VOLTAGE SYSTEM ISOLATION RESISTANCE MEASUREMENT

CLAIM OF PRIORITY

This application claims priority to U.S. Provisional Application No. 62/027,515, which is entitled "System And Method For High Voltage System Isolation Resistance Measurement," and was filed on Jul. 22, 2014, the entire contents of which are hereby incorporated by reference herein.

FIELD

This disclosure relates generally to the field of electrical power systems and, more specifically, to systems and methods for measurement of isolation resistance in a high-voltage system.

BACKGROUND

Figure 1:
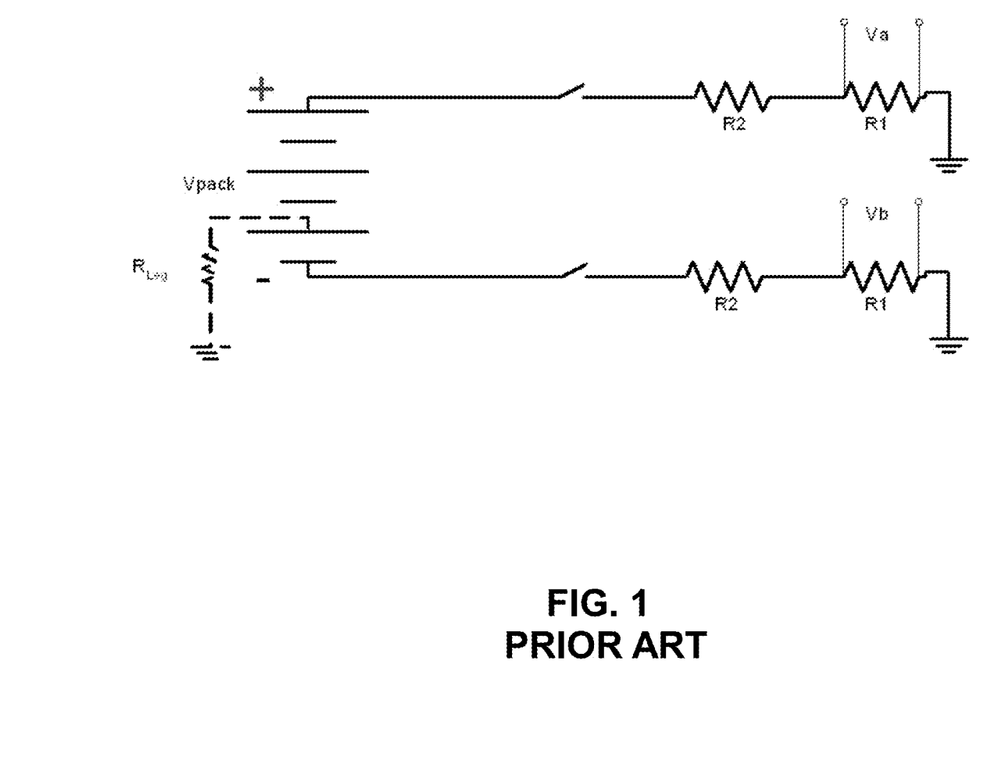
FIG. 1 is a diagram of a prior art isolation resistance measurement circuit.

Battery systems often include monitoring devices that measure the high voltage isolation resistance in a battery pack. FIG. 1 depicts a schematic diagram of a prior-art measurement circuit. In FIG. 1 isolation resistance in the resistor $R_{Leg}$ is identified using the following equation:

$$R_{Leg} = \frac{V_{pack} - (R1 + R2) * \frac{(Va + Vb)}{R1}}{\frac{Va + Vb}{R1}}.$$

The resistance $R_{Leg}$ is equivalent to the isolation resistance ($R_{ISOBatt}$) of the battery. FIG. 1 depicts a circuit with two switches, where a first switch is connected in a + line and a second switch is connected in the − line. The isolation resistance refers to a resistance between the battery and electrical ground and is often referenced in terms of ohms per volt. Existing high-voltage systems use mechanical relays or photo-MOS (solid state relay) switches.

In high-voltage battery systems, the switching hardware that is required to operate the prior art monitoring circuit adds to the expense and complexity of the battery system. Consequently, alternative monitoring circuits that measure the isolation resistance $R_{ISOBatt}$ without requiring additional high-voltage components specifically for the purpose of measuring isolation resistance would be beneficial.

SUMMARY

A circuit that measures isolation resistance in a battery pack has been developed. The circuit includes a first resistor with a first terminal connected to a positive terminal of a battery cell pack and a positive contactor that is configured to be connected to a load and a second terminal that is connected to a low voltage ground, a second resistor connected in series with the first resistor with a first terminal connected to the second terminal of the first transistor and the low voltage ground and a second terminal connected to a negative terminal of a battery cell pack and a negative contactor that is configured to be connected to the load, a third resistor in the load with a first terminal configured to be connected to the positive contactor and a second terminal connected to the low voltage ground, a fourth resistor in the load with a first terminal connected to the second terminal of the third resistor and the low voltage ground and a second terminal configured to be connected to the negative contactor, at least one voltmeter configured to measure a first voltage across the first resistor between the positive terminal of the battery pack and the low voltage ground and a second voltage across the first transistor and the second transistor between the positive terminal of the battery pack and the negative terminal of the battery pack, and a controller operatively connected to the first contactor, the second contactor, and the at least one voltmeter. The controller is configured to operate the first contactor and the second contactor to disconnect the battery cell pack from the load, generate a first voltage measurement for the first voltage and a second voltage measurement for the second voltage while the first contactor and the second contactor disconnect the battery cell pack from the load, operate the first contactor and the second contactor to connect the battery cell pack to the load, generate a third voltage measurement for the first voltage and a fourth voltage measurement for the second voltage while the first contactor and the second contactor connect the battery cell pack to the load, and identify an isolation resistance for the battery cell pack with reference to the first, second, third, and fourth voltage measurements and resistance values of the first, second, third, and fourth resistors.

In one embodiment, an isolation resistance measurement circuit that measures an isolation resistance of a battery has been developed. The circuit includes a first plurality of resistors connected in parallel to a plurality of battery cells in a battery cell pack, a second plurality of resistors in a load that receives power from the battery cell pack, a first contactor configured to connect and disconnect a first terminal of the battery cell pack from a first terminal of the load, and a controller operatively connected to the first contactor. The controller is configured to operate the first contactor to disconnect the battery cell pack from the load, identify a first voltage and a second voltage in the first plurality of resistors within the battery cell pack while the battery cell pack is disconnected from the load, operate the first contactor to connect the battery cell pack to the load, identify a third voltage and a fourth voltage in the first plurality of resistors within the battery cell pack while the battery cell pack is connected to the load, and identify an isolation resistance of the battery cell pack with reference to the first, second, third, and fourth voltages and predetermined resistance values of the first plurality of resistors and the second plurality of resistors.

In another embodiment, an isolation resistance measurement circuit that measures an isolation resistance of a battery has been developed. The circuit includes a battery cell pack including a plurality of battery cells including a first terminal and a second terminal, a first sensing resistor connected to the first terminal of the battery cell pack, a second sensing resistor arranged to form a series connection with the first sensing resistor and to the second terminal of the battery cell pack, a third resistor connected to the series connection between the first sensing resistor and second sensing resistor and the third resistor being connected to a switching device, the switching device being further connected to the second terminal of the battery cell pack, and a controller operatively connected to the switching device. The controller is configured to operate the switching device to disconnect the third resistor from the second terminal of the battery cell pack, identify a first voltage between the first terminal and the second terminal of the battery cell pack and a second voltage while the third resistor is disconnected from the second terminal of the battery cell pack, operate the switching device to connect the third resistor to the second terminal of the battery cell pack, identify a third voltage between the first terminal and the second terminal of the battery cell pack and a fourth voltage in the first plurality of resistors within the battery cell pack while the third resistor is connected to the second terminal of the battery cell pack, and identify an isolation resistance of the battery cell pack with reference to the first voltage, the second voltage, the third voltage, the fourth voltage, and predetermined resistance values of the first sensing resistor, the second sensing resistor, and the third resistor.

DETAILED DESCRIPTION

For the purposes of promoting an understanding of the principles of the embodiments disclosed herein, reference is now be made to the drawings and descriptions in the following written specification. No limitation to the scope of the subject matter is intended by the references. The present disclosure also includes any alterations and modifications to the illustrated embodiments and includes further applications of the principles of the disclosed embodiments as would normally occur to one skilled in the art to which this disclosure pertains.

Figure 2:
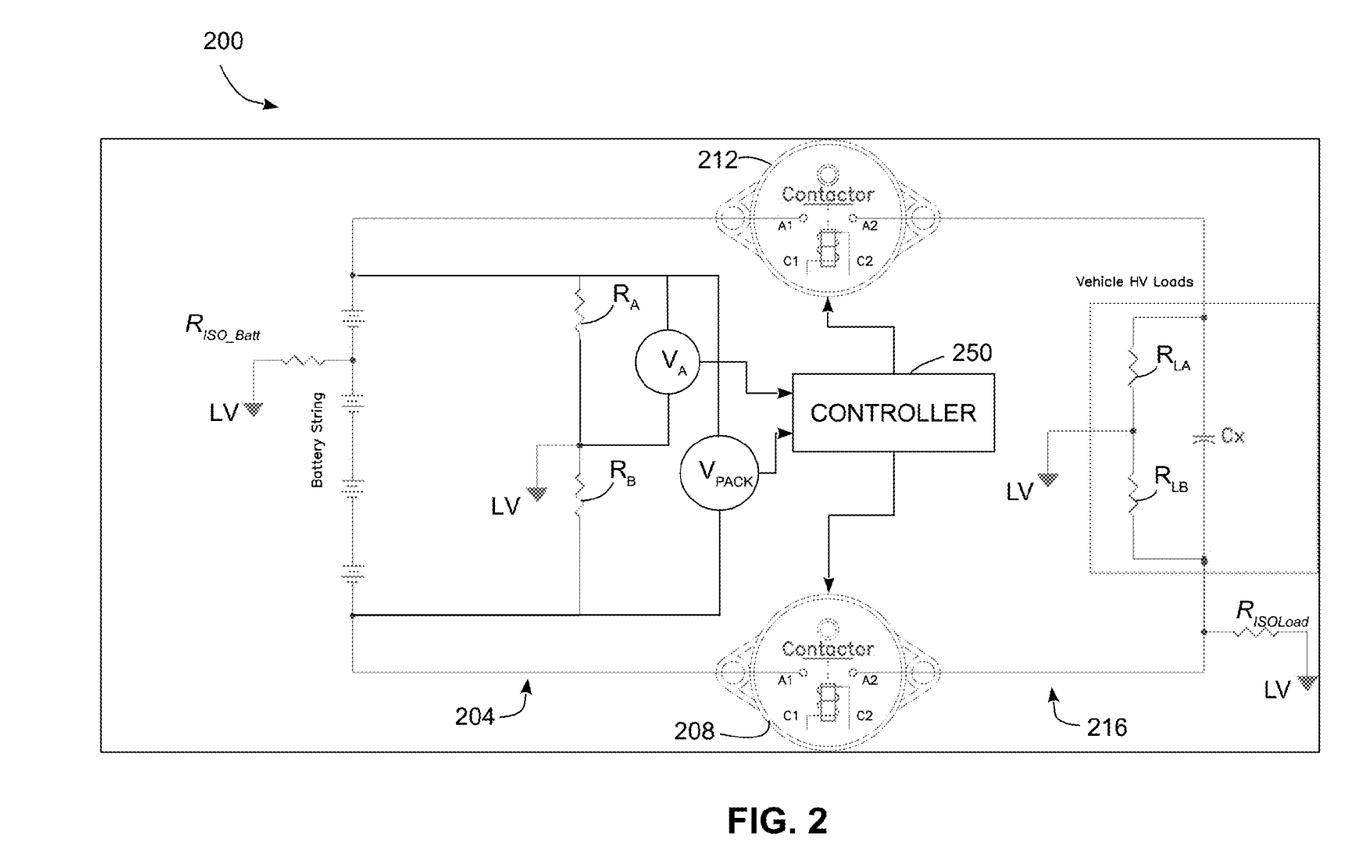
FIG. 2 is a diagram of a circuit for measuring isolation resistance in a battery using internal resistors in the battery and external resistors in a load that is connected to the battery.

FIG. 2 is a schematic diagram of a circuit that is configured to measure isolation resistance in a battery pack. The circuit in FIG. 2 includes a battery pack 204 that incorporates one or more individual battery cells with a negative contactor 208 and positive contactor 212 that connect the battery pack 204 to a load 216. In the illustrative example of FIG. 2, the load 216 includes a power inverter module for generation of alternating current (AC) outputs that drive electric motors, such as in an electric vehicle, but the battery pack 204 can be connected to a wide range of loads.

In the embodiment of FIG. 2, the battery pack 204 includes series-connected resistors $R_A$, and $R_B$. A voltage measurement terminal $V_A$ is positioned between the resistors $R_A$ and a low-voltage ground LV. The voltage measurement terminal $V_A$ measures voltage across the resistor $R_A$, which has a predetermined resistance (e.g. 1,500 KΩ). In an alternative configuration, the voltage measurement terminal $V_A$ is connected across a second resistor that is connected in series between the resistor $R_A$ and the low-voltage ground LV. The second resistor typically has a lower resistance level to enable more sensitive voltage measurements at the terminal $V_A$. Another voltage measurement terminal $Vp_{PACK}$ measures the total voltage across resistors $R_A$ and $R_B$, which corresponds to the total voltage across the output terminals of the battery pack. In the illustrative embodiment of FIG. 2, one voltmeter is connected to $V_A$ and $V_{PACK}$ at different times to measure the respective voltage levels, while in another embodiment two different voltmeters measure $V_A$ and $V_{PACK}$ simultaneously. The resistor $R_B$ has another predetermined resistance (e.g. 3,000 KΩ). In an alternative embodiment, the pack voltage $Vp_{PACK}$ is measured across two lower-resistance resistors with one resistor connected in series between the resistor $R_A$ and LV, and the other resistor connected in series from LV to the resistor $R_B$ to enable more sensitive voltage measurements for $V_{PACK}$. The load 216 includes two series connected resistors $R_{LA}$ and $R_{LB}$. The resistors $R_{LA}$ and $R_{LB}$ each have predetermined resistance values (e.g. 3,000 KΩ and 1,500 KΩ, respectively). The low-voltage (LV) ground is connected between the resistors $R_A$ and $R_B$ and the resistors $R_{LA}$ and $R_{LB}$. In a motor vehicle embodiment, the low voltage ground LV is the chassis of the vehicle. During operation, the combined resistances $R_A$, $R_B$, $R_{LA}$, and $R_{LB}$ prevent substantial amounts of current from flowing to the low-voltage ground LV.

In the configuration of FIG. 2, the resistance $R_{ISOBatt}$ is modeled as being internal to the battery, such as between a system fuse and one of the cells in the battery. Many larger battery packs include multiple cells, and FIG. 2 depicts $R_{ISObatt}$ in a configuration between cells in the battery pack. In order to identify the isolation resistance $R_{ISOBatt}$, the measurement process measures the voltages $V_A$ and $V_{PACK}$ when the negative connector contactor 208 and positive connector contactor 212 are in different open and closed states as depicted in Table 1:

TABLE 1

| | Positive Contactor | Negative Contactor | Equation Set |
|---|---|---|---|
| State 1 | Open | Open | Equation 1 |
| State 2 | Closed | Closed | Equation 2 |
| State 3 | Open | Closed | Equation 3 |
| State 4 | Closed | Open | Equation 4 |

Figure 3:
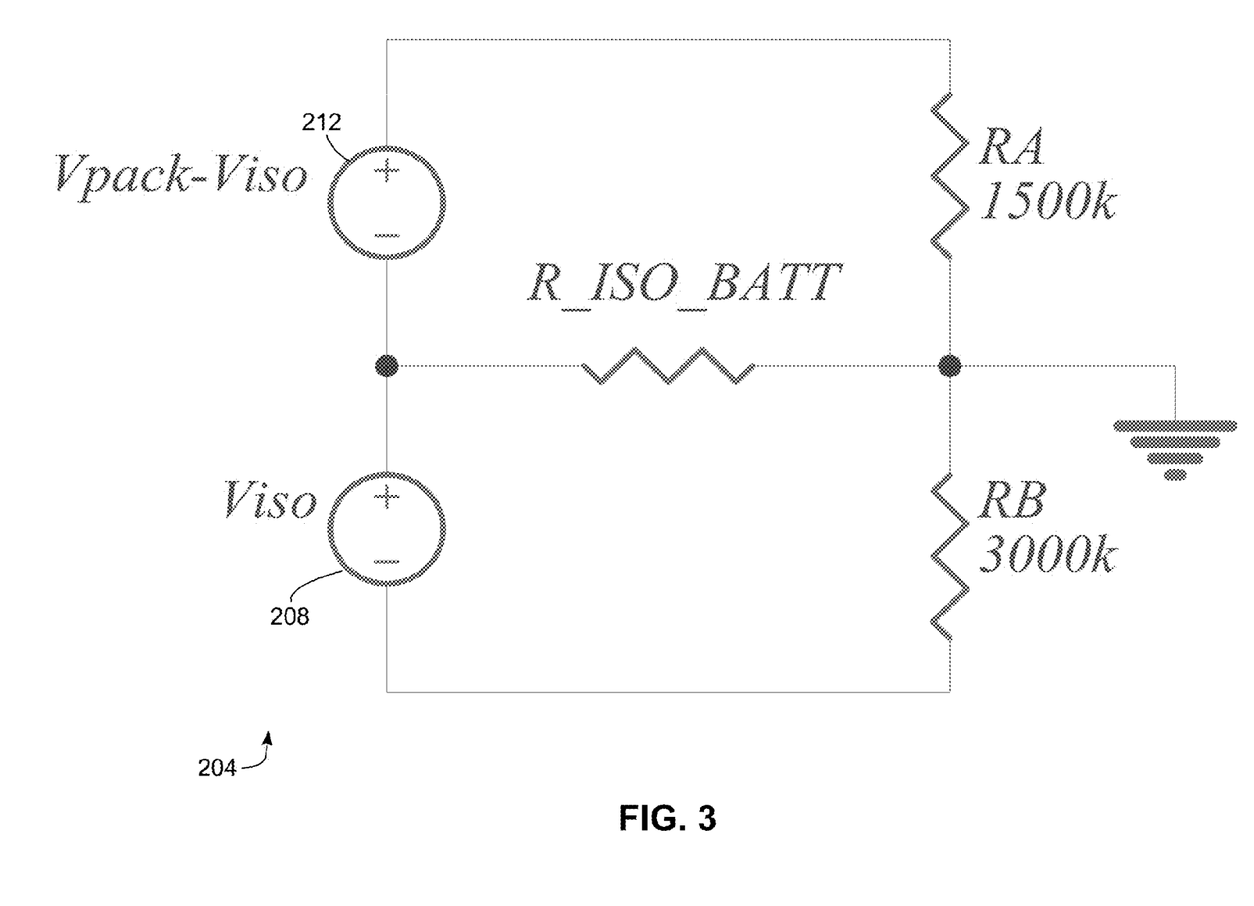
FIG. 3 is a diagram of an equivalent circuit to the circuit of FIG. 2 when the battery is disconnected from the load.

FIG. 3 depicts the equivalent circuit in the battery pack 204 in State 1 when both of the contactor terminals 208 and 212 are opened to disconnect the load 216 from the battery pack 204. In the configuration of FIG. 3, the State Equation 1 is:

$$V_{ISO} = R_{ISOBatt} * \left\{ \frac{V'_{PACK}}{R_b} - \frac{V'_A}{R_a} \right\} + V_b$$

where $V_{ISO}$ is unknown and $R_{ISOBatt}$ is unknown. The terms $V_A'$ and $V_{PACK}'$ refer to the voltage measurements at $V_A$ and $V_{PACK}$ in the first state where both terminals 208 and 212 are open.

Figure 4:
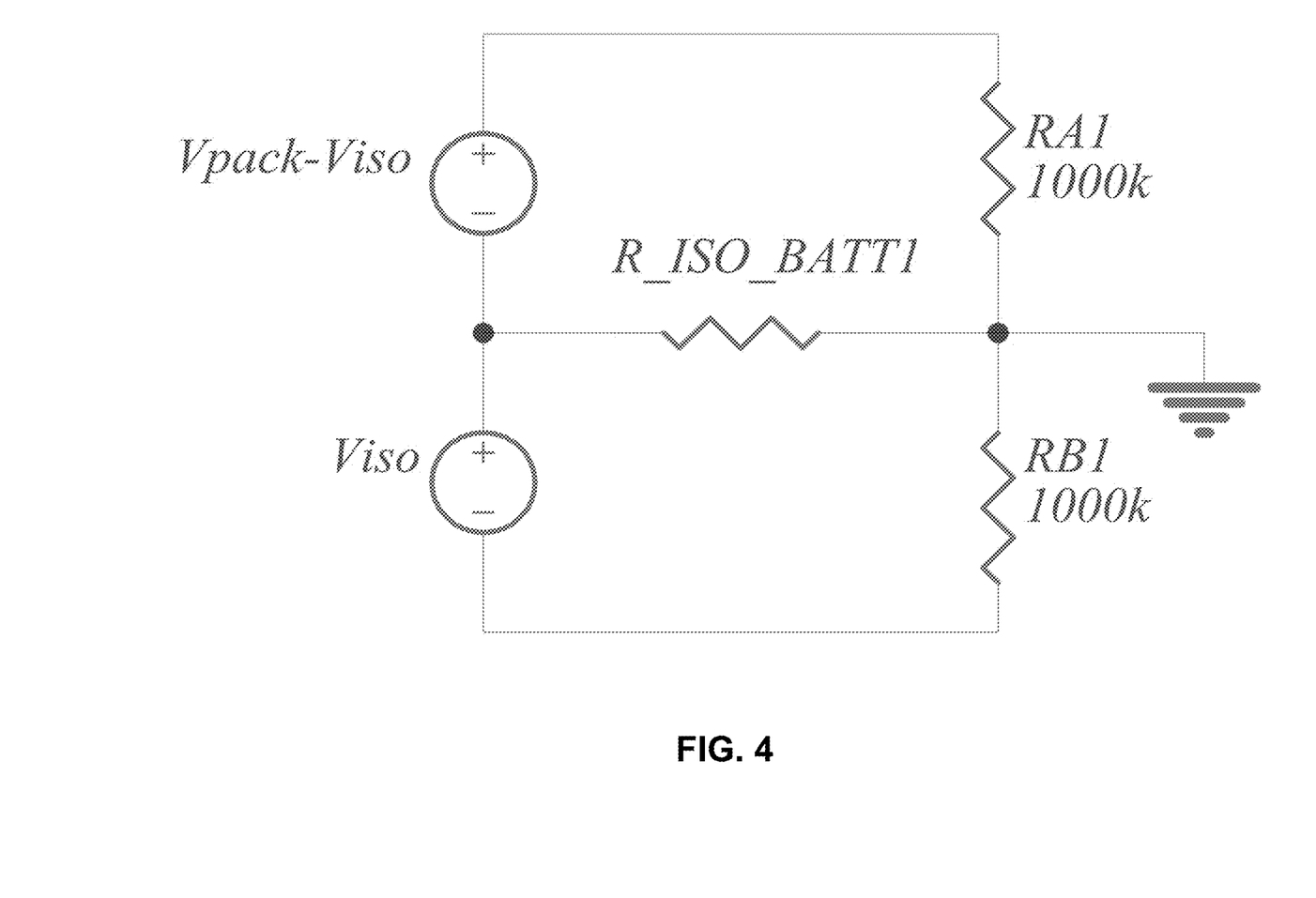
FIG. 4 is a diagram of an equivalent circuit to the circuit of FIG. 2 when the battery is connected from the load with both positive and negative contactors.

As described above, in State 1 the state equation includes two unknown variables. In the second state where both contactor terminals 208 and 212 are closed, the battery pack 204 is connected to the load 216. FIG. 4 depicts the equivalent circuit, where the resistance value $R_{A1}$ corresponds to the parallel resistance of $R_A$ and $R_{LA}$ and the resistance value $R_{B1}$ corresponds to the parallel resistance of $R_B$ and $R_{LB}$. In the configuration of State 2, the State Equation 2 is:

$$V_{ISO} = R_{ISO\_Batt} * \left\{ \frac{V''_{PACK}}{R_{B1}} - \frac{V''_A}{R_B 1} \right\} + V''_{PACK}.$$

In state equation 2, the terms $V_A''$ and $V_{PACK}''$ refer to the measurements of the voltage $V_A$ and $V_{PACK}$, respectively, in state 2 when both the terminals 208 and 212 are closed. In the state equation 2, both $R_{ISOBatt}$ and $V_{ISO}$ are unknown terms. Using a system of two equations that includes state equation 1 and state equation 2, the value of $R_{ISObatt}$ is identified with the following equation:

$$R_{ISO\_Batt} = \frac{V''_{PACK} - V'_{PACK}}{\left\{ \frac{V'_{PACK}}{R_B} - \frac{V'_A}{R_A} - \frac{V''_{PACK}}{R''_B} + \frac{V''_A}{R''_A} \right\}}.$$

Those having skill in the art will recognize that same system of equations can also be used to identify $V_{ISO}$ as well. In the embodiment of FIG. 2, a digital or analog controller 250 is configured to operate the contactors 208 and 212 and to receive the voltage measurements of $V_A$ and $V_{PACK}$ in the first state and second state to identify the value of $R_{ISOBatt}$. If the value of $R_{ISOBatt}$ is lower than a predetermined operating threshold, then the controller activates an alarm to indicate that maintenance should be performed on the battery 204 and/or opens the contacts 208 and 212 to electrically isolate the battery 204 from the load 216.

As described above, the circuit of FIG. 2 is reconfigured into two states where the contactors 208 and 212 are both open and both closed to identify the value of $R_{ISOBatt}$. The circuit 200 is additionally configured to identify the value of the load isolation resistance $R_{ISOLoad}$. In one configuration, the value of $R_{ISOLoad}$ is identified after the values of $R_{ISOBatt}$ and $V_{ISOBatt}$ have been identified using the state equations 1 and 2 described above. The value of $R_{ISOLoad}$ is identified when the circuit is either in state 3 where the negative contactor 208 is closed and the positive contactor 212 is open or in the fourth state where the negative contactor 208 is open and the positive contactor 212 is closed. The following state equations can be solved for $R_{ISOLoad}$ when $R_{ISOBatt}$ and $V_{ISO}$ have already been identified:

$$R_{ISOBatt} * \left\{ \frac{V_B'''}{\frac{1}{\frac{1}{R_B'''} + \frac{1}{R_{ISOLoad}}}} - \frac{V_A'''}{R_a} \right\} + V_{PACK}''' \quad \text{State Equation 3}$$

$$V_{ISO} = R_{ISOBatt} * \left\{ \frac{V_B''''}{R_B} - \frac{V_A''''}{\frac{1}{\frac{1}{R_A''''} + \frac{1}{R_{ISOLoad}}}} \right\} + V_{PACK}'''' \quad \text{State Equation 4}$$

In another configuration, the values of $R_{ISOBatt}$, $R_{ISOLoad}$, and $V_{ISO}$ are identified as the battery pack 204 operates in states 1, 3, and 4. Voltage measurements during state 2 are not required for the identification of the $R_{ISOBatt}$, $R_{ISOLoad}$, and $V_{ISO}$. The following state equations for states 1, 3, and 4 that form a system of equations to identify $R_{ISOBatt}$, $R_{ISOLoad}$, and $V_{ISO}$ are set forth below:

$$V_{ISO} = R_{ISO\_Batt} * \left\{ \frac{V'_{PACK}}{R_B} - \frac{V'_A}{R_A} \right\} + V_{PACK} \quad \text{State Equation 1}$$

$$R_{ISOBatt} * \left\{ \frac{V'''_{PACK}}{\frac{1}{\frac{1}{R_B'''} + \frac{1}{R_{ISOLoad}}}} - \frac{V_A'''}{R_A} \right\} + V_{PACK}''' \quad \text{State Equation 3}$$

$$V_{ISO} = R_{ISOBatt} * \left\{ \frac{V_{PACK}''''}{R_B} - \frac{V_A''''}{\frac{1}{\frac{1}{R_A''''} + \frac{1}{R_{ISOLoad}}}} \right\} + V_{PACK}'''' \quad \text{State Equation 4}$$

In some operating modes that are used in electric vehicles, the battery pack 204 and load 216 operate in the following cycle: State 1 (both contactors 208 and 212 open), State 3 (contactor 208 closed, contactor 212 open), State 2 (both contactors 208 and 212 closed), and State 4 (contactor 208 open, contactor 212 closed). Thus, during the cycle of operation, the battery pack 204 and load 216 transition between states 1, 3, and 4 to enable a controller to identify both $R_{ISOBatt}$ and $R_{ISOLoad}$.

Figure 5:
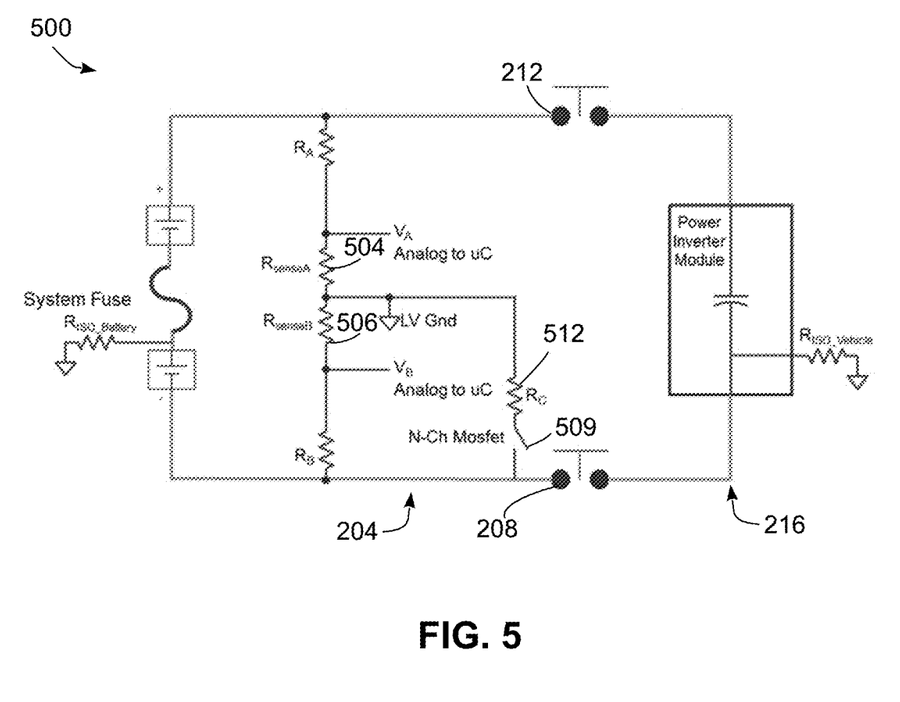
FIG. 5 is a diagram of another circuit for measuring isolation resistance in a battery that incorporates an N-type field effect transistor (FET) to prevent leakage in a high-voltage portion of the circuit.

FIG. 5 depicts another embodiment of the circuit of FIG. 2. In the circuit 500 of FIG. 5, the low-voltage ground is connected to another resistor $R_C$ 512 and an N-channel MOSFET 509 is connected to the negative contactor 208 within the battery pack 204. The circuit 500 omits the load resistors $R_{LA}$ and $R_{LB}$. The circuit 500 includes a first sensing resistor 504 that is connected in series with a second sensing resistor 506. The circuit 500 includes one or more voltmeters that identify a voltage across the full battery cell pack between the terminals 208 and 212 and also identifies a second voltage ($V_A$ to $V_B$) across the sensing resistors $R_{senseA}$ 504 and $R_{senseB}$ 506. The voltage across the sensing resistors 504 and 506 varies depending upon the state of the switch 509 that is either open to prevent a flow current through the resistor $R_C$ 512 or closed to enable current to flow through the resistor $R_C$ 512. During operation, the controller operates the N-channel MOSFET opens and closes to generate an equivalent to the second state in the table 1. In the configuration of FIG. 5, a controller operates the N-channel MOSFET to place the battery pack 204 in the first state (both contacts 208 and 212 open) and the second state where contacts 208 and 212 are effectively "closed" with the resistance $R_c$ 512 acting as a substitute for the load resistance. While not expressly depicted in FIG. 5, the circuit includes a controller that operates the contactors 208 and 212, the N-channel MOSFET, and receives voltage measurements from $V_A$ and $V_{PACK}$. The controller identifies $R_{ISOBatt}$ based on the measured battery cell pack and sensing resistor voltages in association with the predetermined resistance values of the resistors in the circuit 500 during the two different states of the battery pack 204 without requiring the presence of the load 216.

Figure 6:
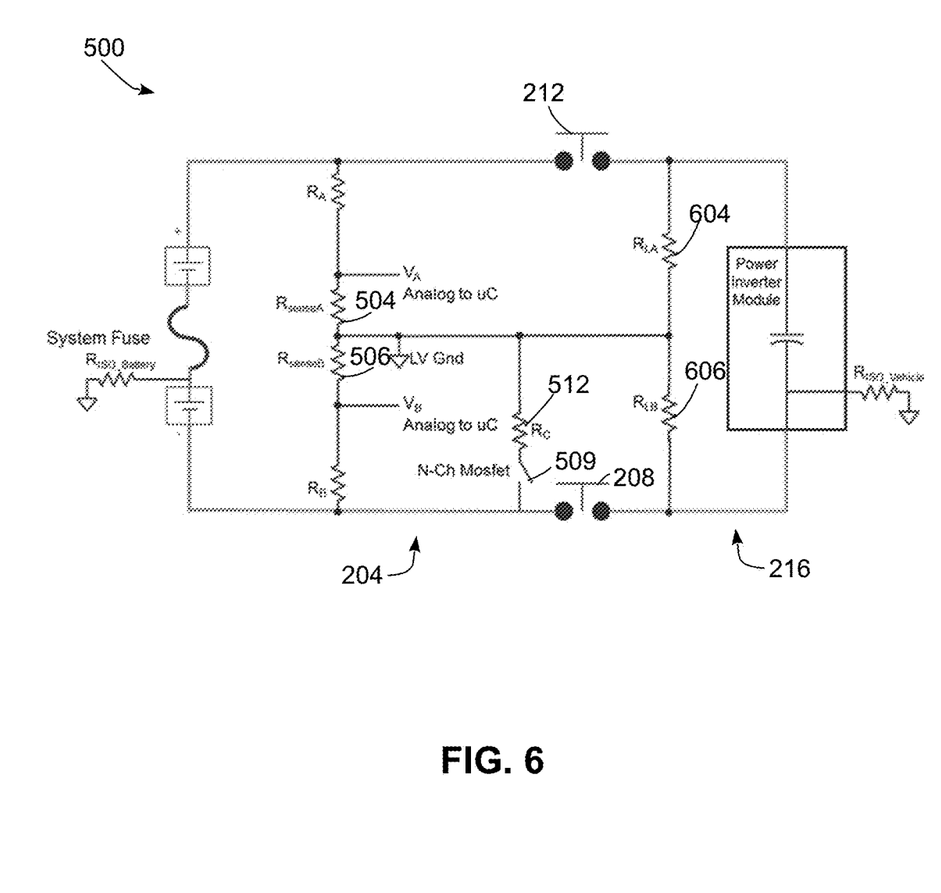
FIG. 6 is a diagram of another circuit for measuring isolation resistance in a battery that incorporates an N-type FET to enable measurement of an isolation resistance in the battery without requiring additional resistors in the load.

FIG. 6 depicts another configuration of the circuit 500 from FIG. 5. The circuit in FIG. 6 includes the resistor $R_C$ and N-channel MOSFET that is depicted in FIG. 5 and further includes the load-side resistors $R_{LA}$ 604 and $R_{LB}$ 606 that are connected in series between the first and second terminals of the battery cell pack when the contactors 212 and 208 are closed. The connection between the resistors 604 and 606 is also connected to the resistor $R_c$ 512 and between the sensing resistors $R_A$ 504 and $R_B$ 506, which are tied to the low-voltage ground. While not expressly depicted in FIG. 6, the circuit includes a controller that operates the contactors 208 and 212, the N-channel MOSFET, and receives voltage measurements from $V_A$ and $V_{PACK}$. The controller identifies $R_{ISOBatt}$ in a similar manner to the circuit configuration in FIG. 5 including the predetermined resistance values of $R_{LA}$ 604 and $R_{LB}$ 606, which affect the first measured voltage across the battery cell pack terminals and the second measured voltage across the sensing resistors $R_A$ 504 and $R_B$ 506. The circuit configuration of FIG. 6 enables the measurement circuit to identify the isolation resistance $R_{ISOBatt}$ while the battery is connected to the load during operation without requiring opening and closing of the contactors 208 and 212 to measure the voltage levels $V_A$ and $V_{PACK}$ in different connection states between the battery 204 and the load 216.

It will be appreciated that variants of the above-disclosed and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. A battery isolation resistance measurement circuit comprising:
   a first plurality of resistors connected in parallel to a plurality of battery cells in a battery cell pack;
   a second plurality of resistors in a load that receives power from the battery cell pack;
   a first contactor configured to connect and disconnect a first terminal of the battery cell pack from a first terminal of the load; and
   a controller operatively connected to the first contactor, the controller being configured to:
      operate the first contactor to disconnect the battery cell pack from the load;
      identify a first voltage and a second voltage in the first plurality of resistors within the battery cell pack while the battery cell pack is disconnected from the load;
      operate the first contactor to connect the battery cell pack to the load;
      identify a third voltage and a fourth voltage in the first plurality of resistors within the battery cell pack while the battery cell pack is connected to the load; and
      identify an isolation resistance of the battery cell pack with reference to the first, second, third, and fourth voltages and predetermined resistance values of the first plurality of resistors and the second plurality of resistors.

2. The circuit of claim 1 further comprising:
   a second contactor configured to connect and disconnect a second terminal of the battery cell pack from a second terminal of the load; and
   the controller being operatively connected to the second contactor, the controller being further configured to:
      operate the first contactor and the second contactor to disconnect the battery cell pack from the load;
      identify the first voltage and the second voltage in the first plurality of resistors within the battery cell pack while both the first contactor and the second contactor disconnect the battery cell pack from the load;
      operate the first contactor and the second contactor to connect the battery cell pack to the load; and
      identify the third voltage and the fourth voltage in the first plurality of resistors within the battery cell pack while the first contactor and the second contactor connect the battery cell pack to the load.

3. The circuit of claim 2, the controller being further configured to:
   operate the first contactor to disconnect the first terminal of the battery cell pack from the load;
   operate the second contactor to connect the first terminal of the battery cell pack from the load;
      identify a fifth voltage and a sixth voltage in the first plurality of resistors within the battery cell pack while the first contactor is disconnected from the load and the second contactor is connected to the load; and
      identify an isolation resistance of the load with reference to the fifth voltage, the sixth voltage, the isolation resistance of the battery cell pack, and the predetermined resistance values of the first plurality of resistors and the second plurality of resistors.

4. The circuit of claim 1 further comprising:
   a first voltmeter configured to measure voltage across a first resistor in the first plurality of resistors, the first resistor being connected to the first terminal of the battery cell pack;
   a second voltmeter configured to measure voltage across the first terminal and the second terminal of the battery cell pack; and
   the controller being operatively connected to the first voltmeter and the second voltmeter, the controller being configured to:
      identify the first voltage in the first plurality of resistors with reference to a first voltage measurement from the first voltmeter while the battery cell pack is disconnected from the load;
      identify the second voltage in the first plurality of resistors with reference to a second voltage measurement from the second voltmeter while the battery cell pack is disconnected from the load;
      identify the third voltage in the first plurality of resistors with reference to a third voltage measurement from the first voltmeter while the battery cell pack is connected to the load;
      identify the fourth voltage in the first plurality of resistors with reference to a fourth voltage measurement from the second voltmeter while the battery cell pack is connected to the load.

5. The circuit of claim 1, the controller being further configured to:
   identify an isolation voltage of the battery cell pack with reference to the isolation resistance of the battery cell pack, third and fourth voltages, and the resistance values of the first plurality of resistors.

6. The circuit of claim 1 wherein a low voltage ground is connected between a first resistor and a second resistor in the first plurality of resistors.

7. A battery isolation resistance measurement circuit comprising:
   a battery cell pack including a plurality of battery cells including a first terminal and a second terminal;
   a first sensing resistor connected to the first terminal of the battery cell pack;
   a second sensing resistor arranged to form a series connection with the first sensing resistor and to the second terminal of the battery cell pack;
   a first resistor connected to the series connection between the first sensing resistor and second sensing resistor and the first resistor being connected to a switching device, the switching device being further connected to the second terminal of the battery cell pack; and a controller operatively connected to the switching device, the controller being configured to:
- operate the switching device to disconnect the first resistor from the second terminal of the battery cell pack;
- identify a first voltage between the first terminal and the second terminal of the battery cell pack and a second voltage across the first sensing resistor and the second sensing resistor while the first resistor is disconnected from the second terminal of the battery cell pack;
- operate the switching device to connect the first resistor to the second terminal of the battery cell pack;
- identify a third voltage between the first terminal and the second terminal of the battery cell pack and a fourth voltage across the first sensing resistor and the second sensing resistor while the first resistor is connected to the second terminal of the battery cell pack; and
- identify an isolation resistance of the battery cell pack with reference to the first voltage, the second voltage, the third voltage, the fourth voltage, and predetermined resistance values of the first sensing resistor, the second sensing resistor, and the first resistor.

8. The circuit of claim 7, wherein the switching device is an n-channel MOSFET.

9. The circuit of claim 7 further comprising:
- a load connected to the first terminal and the second terminal of the battery cell pack, the load further comprising:
  - a second resistor connected in series with a third resistor, the second resistor being further connected to the first terminal, the third resistor being further connected to the second terminal, and a connection between the second and third resistors being connected to between the first sensing resistor and the second sensing resistor and to the first resistor; and
- the controller being further configured to identify the isolation resistance of the battery cell pack with reference to predetermined resistance values of the second resistor and the third resistor in a configuration with the load being connected to the battery cell pack.

* * * * *